United States Patent
Malhotra et al.

(10) Patent No.: US 7,405,153 B2
(45) Date of Patent: Jul. 29, 2008

(54) METHOD FOR DIRECT ELECTROPLATING OF COPPER ONTO A NON-COPPER PLATEABLE LAYER

(75) Inventors: Sandra G. Malhotra, Santa Clara, CA (US); Hariklia Deligianni, Tenafly, NJ (US); Stephen M. Rossnagel, Pleasantville, NY (US); Xiaoyan Shao, Yorktown Heights, NY (US); Tsong-Lin Tai, Stormville, NY (US); Oscar van der Straten, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 227 days.

(21) Appl. No.: 11/306,932

(22) Filed: Jan. 17, 2006

(65) Prior Publication Data

US 2007/0166995 A1 Jul. 19, 2007

(51) Int. Cl.
*H01L 21/00* (2006.01)
*H01L 21/44* (2006.01)

(52) U.S. Cl. ............... 438/628; 438/618; 438/686; 438/724; 438/952; 257/E21.081; 257/E21.261; 257/E21.577; 257/E21.579

(58) Field of Classification Search ............... 438/618; 257/E21.081, E21.261, E21.577
See application file for complete search history.

(56) References Cited

U.S. PATENT DOCUMENTS

| | | | |
|---|---|---|---|
| 3,951,843 A * | 4/1976 | Jacob .................. | 252/187.2 |
| 6,417,062 B1 | 7/2002 | Foust et al. | |
| 6,455,414 B1 * | 9/2002 | Hillman et al. ............ | 438/628 |
| 6,596,149 B2 | 7/2003 | Horii | |
| 6,709,562 B1 | 3/2004 | Andricacos et al. | |
| 6,787,912 B2 | 9/2004 | Lane et al. | |
| 6,812,143 B2 | 11/2004 | Lane et al. | |
| 6,875,518 B2 | 4/2005 | Shiho et al. | |
| 6,974,768 B1 * | 12/2005 | Kailasam ................ | 438/625 |
| 7,229,911 B2 * | 6/2007 | Rajagopalan et al. ....... | 438/624 |
| 2004/0007473 A1 * | 1/2004 | Yang ....................... | 205/291 |
| 2004/0069648 A1 | 4/2004 | Andricacos et al. | |
| 2004/0164293 A1 | 8/2004 | Maloney et al. | |
| 2004/0180292 A1 | 9/2004 | Lee et al. | |
| 2005/0199502 A1 | 9/2005 | Andricacos et al. | |

FOREIGN PATENT DOCUMENTS

| | | | |
|---|---|---|---|
| JP | 2002201162 A1 | | 7/2002 |
| JP | WO0232839 A1 | | 1/2003 |
| JP | 2007194624 | * | 8/2007 |

* cited by examiner

*Primary Examiner*—Michael S Lebentritt
(74) *Attorney, Agent, or Firm*—Lisa U. Jaklitsch

(57) ABSTRACT

A process for the formation of an interconnect in a semiconductor structure including the steps of forming a dielectric layer on a substrate, forming a first barrier layer on the dielectric layer, forming a second barrier layer on the first barrier layer, wherein the second barrier layer is selected from the group consisting of ruthenium, platinum, palladium, rhodium and iridium and wherein the formation of the second barrier layer is manipulated so that the bulk concentration of oxygen in the second barrier layer is 20 atomic percent or less, and forming a conductive layer on the second barrier layer. The process may additionally include a step of treating the second barrier to reduce the amount of oxide on the surface of the second barrier layer.

22 Claims, 1 Drawing Sheet

METHOD FOR DIRECT ELECTROPLATING OF COPPER ONTO A NON-COPPER PLATEABLE LAYER

BACKGROUND OF THE INVENTION

The present invention is directed to the electroplating of copper onto a semiconductor structure and, more particularly, to the direct electroplating of copper onto a non-copper plateable layer without an intervening copper seed layer.

In damascene processing, the interconnect structure or wiring pattern is formed within a dielectric layer. Using known techniques a photoresist material is used to define the wiring pattern. The patterned photoresist acts as a mask through which a pattern of the dielectric material is removed by a subtractive etch process such as plasma etching or reactive ion etching. The etched openings are used to define wiring patterns in the dielectric layer. The wiring patterns are then filled with a metal using a filling technique such as electroplating, electroless plating, chemical vapor deposition, physical vapor deposition or a combination thereof. Excess metal can then be removed by chemical mechanical polishing through a process known as planarization.

In a single damascene process, via openings are provided in the dielectric layer and filled with a conducting metal, which is often referred to as metallization, to provide electrical contact between layers of wiring levels. In a dual damascene process, the via openings and the wiring pattern are both provided in the dielectric layer before filling with the conducting metal. Damascene processing followed by metallization is continued for each layer until the integrated circuit device is completed.

Barrier layer films are needed between the dielectric material and the conductive material in order to prevent atoms of the conductive material from migrating into and at times through the dielectric material and into other active circuit device structures. For example, barrier layers are used in conjunction with conductive materials, such as those used in interconnect wiring layers, to isolate the conductive materials from the dielectric material. Migration of conductive material in the device can cause inter-level or intra-level shorts through the dielectric material. In some cases, device functionality can be destroyed.

Migration is a particular concern when copper is used as the conductive interconnect material because copper exhibits relatively high mobility in dielectric materials used in semiconductor structures. Yet, in spite of this problem, copper is a favored material for interconnects because of its superior conductivity and good electromigration resistance. As a result, if copper is used in an interconnect structure, the copper needs to be confined with a barrier layer such as that disclosed in U.S. Pat. No. 6,709,562, the disclosure of which is incorporated by reference herein.

A barrier layer conventionally used in conjunction with copper interconnect structures is tantalum and tantalum nitride. However, because these barrier materials are more reactive than copper, the formation of interfacial oxides can result in poor adhesion properties between the deposited copper and the barrier material. Due to the presence of the contaminating oxides, these conventional barrier materials usually require the deposition of a copper seed layer prior to standard copper electrodeposition in a copper acid bath. Electrodeposition of copper is generally only suitable for applying copper to an electrically conductive layer. As such, the copper seed layer provides the additional purpose of being electrically conductive to facilitate the electrodeposition of copper.

The copper seed layer is typically deposited by a nonconformal vapor deposition process which heretofore has worked well. However, as critical dimensions get smaller, for example less than about 45 nm, the seed layer may pinch off the damascene openings, thereby leading to voids, or may not completely cover the walls of the damascene openings.

Accordingly, a new wiring scheme is being proposed in which ruthenium, platinum, palladium, rhodium and iridium are utilized in conjunction with a barrier layer such as tantalum nitride as a liner in place of the typical metal stack of tantalum nitride and tantalum which requires a copper seed layer.

Others have proposed the use of ruthenium (and like metals such as platinum, palladium, rhodium and iridium) in semiconductor structures. Lane et al. U.S. Pat. No. 6,787,912, the disclosure of which is incorporated by reference herein, discloses a dual barrier structure in which a first layer, for example tantalum nitride or tungsten nitride, is in contact with the dielectric layer while a second layer, for example, ruthenium, rhodium or palladium is in contact with the copper layer. The second layer is touted as being directly electroplateable by copper without the need of a copper seed layer.

However, while ruthenium (and like metals such as platinum, palladium, rhodium and iridium) per se is directly electroplateable by copper, the quality of the copper can suffer if the ruthenium (and like metals such as platinum, palladium, rhodium and iridium) is improperly deposited or if it has not been pretreated to remove deleterious oxides.

Accordingly, it is a purpose of the present invention to have a process for the electrodeposition of copper directly on a ruthenium, platinum, palladium, rhodium or iridium layer (hereafter "plateable layer").

It is another purpose of the present invention to have a process for the electrodeposition of copper directly on the plateable layer in which the electrodeposited copper is of good quality and tightly adhered to the metallic layer.

It is yet another purpose of the present invention to have a process for the electrodeposition of copper directly on the plateable layer in which a copper seed layer is not required.

These and other purposes of the invention will become more apparent after referring to the following description considered in conjunction with the accompanying drawings.

BRIEF SUMMARY OF THE INVENTION

According to a first aspect of the present invention, there is disclosed a process for the formation of an interconnect in a semiconductor structure, the process comprising the steps of:
forming a dielectric layer on a substrate;
forming a first barrier layer on the dielectric layer;
forming a second barrier layer on the first barrier layer, wherein the second barrier layer is selected from the group consisting of ruthenium, platinum, palladium, rhodium and iridium and wherein the formation of the second barrier layer is manipulated so that the bulk concentration of oxygen in the second barrier layer is 20 atomic percent or less; and
directly forming a conductive layer on the second barrier layer.

According to a second aspect of the invention, there is disclosed a process for the formation of an interconnect in a semiconductor structure, the process comprising the steps of:
forming a dielectric layer on a substrate;
forming a first barrier layer on the dielectric layer;
forming a second barrier layer on the first barrier layer, wherein the second barrier layer is selected from the group consisting of ruthenium, platinum, palladium, rhodium and iridium and wherein the formation of the second barrier layer is manipulated so that the bulk concentration of oxygen in the second barrier layer is 20 atomic percent or less;
treating the second barrier layer so as to reduce the amount of oxide on the surface of the second barrier layer; and
directly forming a conductive layer on the second barrier layer.

According to a third aspect of the present invention, there is disclosed a process for the formation of an interconnect in a semiconductor structure, the process comprising the steps of:

forming a dielectric layer on a substrate;

forming a first barrier layer on the dielectric layer;

forming a second barrier layer on the first barrier layer by one of chemical vapor deposition (CVD) and atomic layer deposition (ALD), wherein the second barrier layer is selected from the group consisting of ruthenium, platinum, palladium, rhodium and iridium and wherein the formation of the second barrier layer is manipulated so that the bulk concentration of oxygen in the second barrier layer is reduced to a level at which a subsequently formed conductive layer appears bright and shiny; and directly forming a conductive layer on the second barrier layer, the conductive layer being bright and shiny due to such reduced level of the bulk concentration of oxygen in the second barrier layer.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
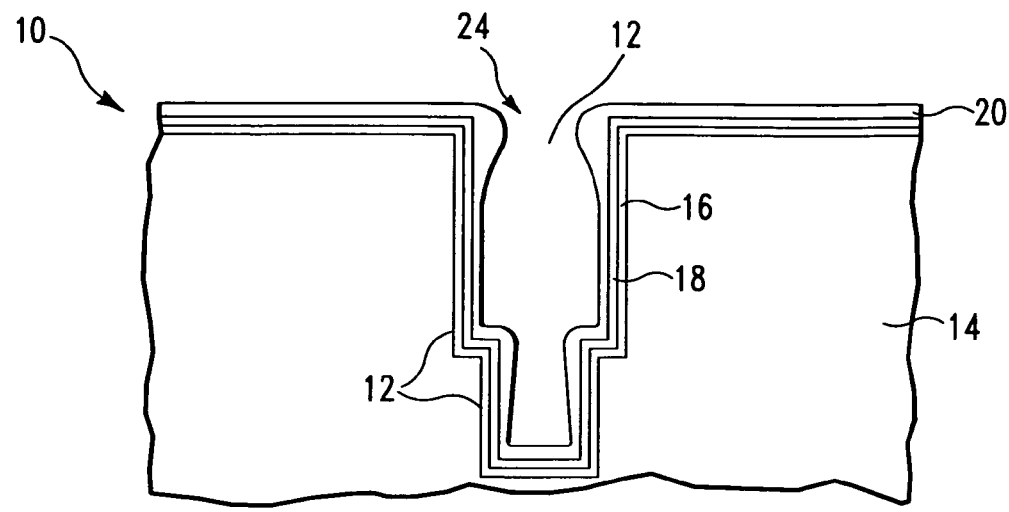
FIG. 1 is a cross sectional view of a prior art semiconductor structure having a copper seed layer.

Referring to the drawings in more detail, and particularly referring to FIG. 1, there is shown a single wiring level of a conventional semiconductor structure 10. For purposes of clarity, any part of the semiconductor structure underneath or above the single wiring level is not shown. It should be understood that there are usually a plurality of such wiring levels which may be above or below the wiring level shown in FIG. 1. The wiring level comprises a dielectric layer 14, a dual damascene opening 12 and lining the dual damascene opening 12 is a dual liner layer comprising, for example, tantalum nitride 16 and then tantalum 18. In place of tantalum nitride 16, other materials that could be utilized are, for example, titanium nitride and tungsten nitride and in place of the tantalum 18, other materials that could be utilized are, for example, titanium and tungsten. On top of the tantalum layer 18 is deposited a copper seed layer 20. The copper seed layer 20 tends to be thicker at the opening 24 to the dual damascene opening 12. While not shown in FIG. 1, copper or other conductive material would be electrodeposited over the copper seed layer 20 to fill the dual damascene opening 12. The thickening of the copper seed layer 20 presents a problem when the dimensions of the dual damascene opening 12 become small as it can pinch off the opening 24, thereby leading to voids in the copper that is subsequently deposited in the dual damascene opening 12. Also, the copper seed layer 20 may be thinly deposited, or not deposited at all, on the side walls of the dual damascene opening 12.

The dielectric layer 14 can be any suitable dielectric layer used in the semiconductor manufacturing industry such as an oxide, e.g., silicon dioxide, nitride, silicon nitride, or an oxynitride layer. Low-k dielectric materials such as SiLK® from Dow Chemical, Coral® from Novellus, Black Diamond® from Applied Materials and spin-on silicon-based dielectrics can also be used. Dielectric layer 14 can be formed by any of various methods including by chemical vapor deposition and spin-on techniques.

Figure 2:
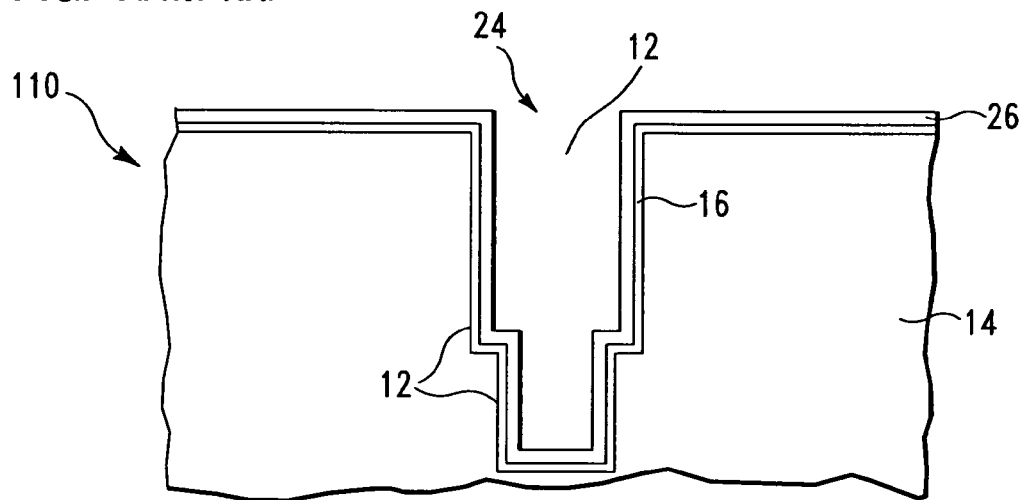
FIG. 2 is a cross sectional view of a semiconductor structure according to the present invention prior to electrodeposition of copper.
Figure 3:
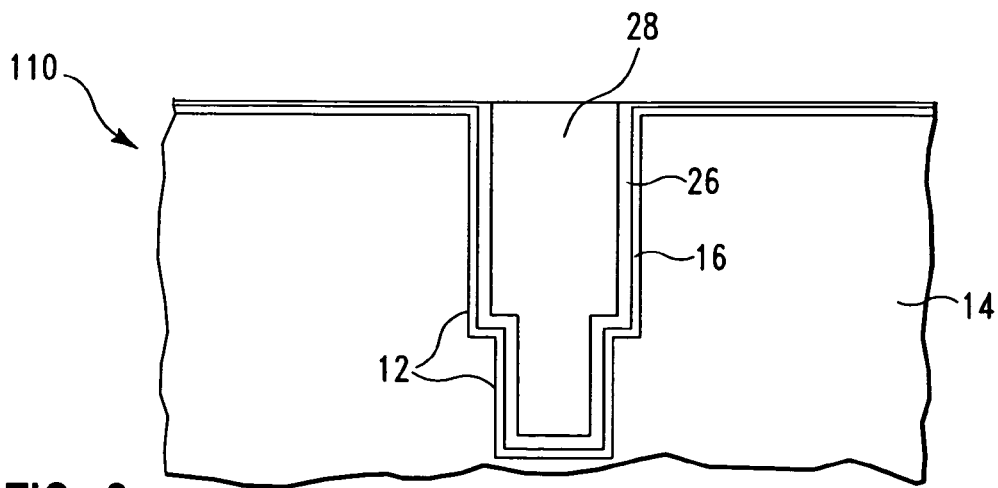
FIG. 3 is a cross sectional view of the semiconductor structure of FIG. 2 after electrodeposition of copper and planarization of the semiconductor structure.

Referring now to FIG. 2, the process of the present invention has been utilized to produce the semiconductor structure 110 shown in FIG. 2 in which dual damascene opening 12 has been made in dielectric layer 14 followed by a barrier layer, for example tantalum nitride 16. Thereafter, a plateable layer 26 is directly deposited onto the tantalum nitride layer 16. This plateable layer 26 is selected from the group consisting of ruthenium, platinum, palladium, rhodium and iridium. It is to be noted that the plateable layer 26 does not pinch off the opening 24 to the dual damascene opening 12 as much as the prior art copper seed layer illustrated in FIG. 1. There are several reasons for this result. First, there is one less layer deposited since the tantalum layer 18 shown in FIG. 1 is not necessary. Second, because the plateable layer 26 is heavier than copper, it deposits more conformally than copper. Third, the atomic layer deposition (ALD) deposition process is available for some of these metals, such as ALD of ruthenium. The ALD process is the most conformal process among chemical vapor deposition (CVD), physical vapor deposition (PVD), and ALD process. The present inventors have the most experience with ruthenium and believe it to be a preferred material for the plateable layer 26, especially since it can be deposited by ALD. Subsequently, copper 28 would be directly electrodeposited onto the plateable layer 26 and into the dual damascene opening 12, preferably followed by a planarization process, such as chemical mechanical polishing, to result in the semiconductor structure 110 shown in FIG. 3.

The plateable layer 26 can be deposited by any means including but not limited to physical vapor deposition (PVD), ionized physical vapor deposition (IPVD), atomic layer deposition (ALD), plasma enhanced atomic layer deposition (PEALD) or chemical vapor deposition (CVD). The thickness of the plateable layer 26 can be in the range of 3 to 40 nanometers (nm).

The present inventors have discovered that it is very desirable to control the amount of oxygen in the bulk of the plateable layer 26 as well as any oxide on the surface of the plateable layer 26. Control of the oxygen in the bulk of the plateable layer 26, it is believed, reduces the resistivity of the plateable layer 26, thereby enabling more uniform plating of the wafer. Since electrical contact with the wafer for electroplating is only made at the outer edges of the wafer, as the resistivity of the metallic layer increases, the quality of the electroplated copper decreases beginning with the center of the wafer since it is furthest from the contacts. For low resistivity (high conductivity), the electroplated copper should be bright and shiny; this is the ideal. As resistivity increases (conductivity decreases), the electroplated copper becomes hazy away from the edge of the wafer and may even be dark at the center of the wafer indicating very poor plating quality.

The present inventors have found that the method of deposition affects the amount of oxygen in the bulk of the plateable layer 26. Those methods that produce less oxygen in the bulk require less manipulation of the process parameters to achieve a desirable level of oxygen in the bulk while those methods that produce more oxygen in the bulk require more manipulation of the process parameters to achieve a desirable level of oxygen in the bulk. Thus, deposition by PVD results in the least oxygen in the bulk while deposition by ALD results in the most oxygen in the bulk. The oxygen content in the bulk of the CVD-deposited plateable layer 26 is in between the PVD and ALD methods. Ionized PVD (IPVD) is similar to the PVD process, which gives very low oxygen impurity. The Plasma Enhanced ALD (PEALD) process uses nitrogen, ammonia, or a mixture of nitrogen and ammonia as the reaction gas in replace of oxygen. Therefore it is reasonable to suggest its oxygen impurity is lower than the ALD process, but higher than the PVD and IPVD processes, which are carried out in a vacuum environment. For deposition of the plateable layer 26, the oxygen must be controlled in order to control the bulk oxygen content of the plateable layer 26. The bulk oxygen content is defined as that oxygen content measured about 10 angstroms below the surface of the plateable layer 26. As will be seen in the examples, the best results are obtained when the oxygen content in the bulk is less than about 20 atomic percent. It should be understood that 20 atomic percent oxygen content is approximate only and may vary somewhat dependent on process conditions. While the most preferred bulk oxygen content should be about 20 atomic percent or less, the bulk oxygen content in any event should be much less than the high fifties atomic percent range as it is known that samples with this bulk oxygen content do not plate well.

The surface oxide of the metallic layer also affects plating quality, but in a different way. In the worse case where the surface of the metallic layer is heavily oxidized, the electroplated copper will be poorly adhered and have a particulate or dusty appearance. The cleaner the surface, the more the electroplated copper will be bright and shiny. It is thus desirable according to the present invention to pretreat the plateable layer 26 so as to condition it for the electroplating of the copper. The oxidation of the plateable layer surface comes from two sources. One is from the plateable layer deposition process, which depends on the deposition method. For PVD, or IPVD, since there is no oxygen exposure during the process, there will be close to zero oxygen contamination. But for some ALD or CVD processes, since there is oxygen containing gas passing through during the deposition, oxygen is incorporated both within the film and on the film surface when the deposition is finished. The other is the natural oxidation of the plateable layer in air or in oxygen containing atmosphere. This surface oxygen content increases with the age of the plateable layer. For example, even for an originally oxygen-free PVD ruthenium film, the surface oxidation in air after leaving the deposition chamber will grow to such an extent that the copper plated on top will be hazy and dark with poor adhesion to the sublayer.

There are several methods of pretreatment possible. In one method of pretreatment, the wafer having the plateable layer 26 can be subjected to forming gas (mixture of hydrogen and nitrogen in the ranges of 2-10% $H_2$ and 98-90% $N_2$), hydrogen plasma or other reducing gas (any mixture of hydrogen with other inert gas, such as argon) at elevated temperatures in the range of 50 to 500° C. to reduce the oxide of the plateable layer 26 back to its elemental metal form. Alternatively, halide ion solutions such as Cl—, Br— or I— or halide gas such as $Cl_2$, $Br_2$ or $I_2$ can be utilized to prepare the surface of the plateable layer 26. As an example of the halide ion solution, the plateable layer can be immerged in a dilute HCl solution, such as 10% HCl, for 1 minute to dissolve some of the surface oxide to achieve good copper plating afterwards. As an example of the halide gas, the plateable layer is placed inside a chamber with $Cl_2$ gas for half an hour, which can reduce the surface oxide back to metal. The downside of these methods with halide ions or gases is the reaction will not stop on the elemental metal (e.g., ruthenium). The process needs good timing to prevent excess etching of the elemental metal (e.g., ruthenium) by halide ions and gases.

Pretreatment is, in general, usually necessary when the plateable layer 26 is formed by CVD, ALD, or PEALD while pretreatment is less generally required when the plateable layer 26 is formed by PVD and IPVD due to the varying amounts of oxygen that are used in the various PVD, IPVD, CVD, ALD, and PEALD processes. Pretreatment may also be necessary, no matter the method of deposition, when the wafers having the plateable layer 26 have been in the queue too long (for example, more than one week) while waiting to be electroplated with copper.

While the ALD process does require the most control to limit the amount of oxygen in the bulk as well as on the surface, the ALD process is most desirable and most preferred since it leads to the most uniform metallic layers. Conversely, while the PVD process results in the lowest amount of oxygen in the bulk and surface, it is the least desirable deposition method because the resulting metallic layer is the least conformal. As will be further illustrated by the examples hereafter, the ALD process can be very well managed according to the teaching of the present invention so that it can be effectively used to deposit the plateable layer 26 which is directly plateable by copper to result in bright, shiny copper metallic layers.

So far, there are methods to deposition ruthenium by PVD, IPVD, CVD, ALD, or PEALD processes. While the other platinum metals, including Pt, Pd, Rh, and Ir, have not been extensively studied for their deposition methods, they usually can be deposited by PVD and IPVD processes.

The present invention is not limited to any specific type of copper plating apparatus, and includes, for example, cup and/or fountain platers (such as "Equinox" from Semitool and "Sabre" from Novellus), thin cell platers (such as "Slim cell" from AMAT and EREX from Ebara) and paddle cells (IBM).

The current densities may typically be expected to range from about 0.1 $mA/cm^2$ to about 100 $mA/cm^2$, and more preferably from about 3 $mA/cm^2$ to about 60 $mA/cm^2$. The voltage depends on the tool configuration. While not limiting the scope of the present invention, the voltage employed typically ranges from about 0 to about 50 volts, such as from about 0 to about 20 volts, or from about 0 to about 10 volts.

The solution chemistry of the plating bath is not limited and includes all plating bath materials disclosed in U.S. Published Application No. 2004/0069648 A1, and U.S. Published Patent application No. 2005/0199502 A1, the disclosures of which are incorporated by reference herein. For example, the plating bath may comprise a copper salt, optionally containing a mineral acid, and optionally one or more additives selected from the group consisting of an inorganic halide salt, an organic sulfur compound with water solubilizing groups, a bath-soluble oxygen-containing compound, a bath-soluble polyether compound, or a bath-soluble organic nitrogen compound that may also contain at least one sulfur atom.

The purposes of the present invention will become more apparent by referring to the following examples.

EXAMPLES

A series of ruthenium samples were made using PVD, CVD and ALD deposition methods. The PVD samples were made by bombarding a high purity Ru target with positively charged argon ions within a high vacuum chamber. The wafer to be deposited was negatively charged, and a thin solid Ru film was deposited on top of the wafer placed in the chamber. The CVD samples were made by thermal decomposition of ruthenium metal organic precursors (such as triruthenium dodecacarbonyl) with or without reactant gases at an elevated temperature on the wafer. The ALD samples were made by a fixed number of cycles of alternate exposures of a Ru-containing source chemical (such as bis(2,4-dimethylpentadienyl)ruthenium, or DMRu) and reactant gas (such as oxygen, ammonia) to a substrate. Each cycle of ALD Ru consisted of the following sequence of four steps: the substrate was exposed to precursor for 1 to 4 seconds, the ALD reactor was evacuated for 1-2 seconds, then reactant gas was introduced at a flow rate of 5 or 10 sccm for 1 to 4 sec after which the ALD reactor was evacuated. Immediately after completion of the first cycle of ALD Ru, the next cycle of ALD Ru was started until all cycles of ALD Ru were completed.

The ruthenium surface oxide and bulk oxygen were measured by XPS (X-Ray Photo-electron Spectroscopy). The surface oxide was measured with XPS on the surface of the sample as received, while the bulk oxygen was measured after the samples were sputter etched slightly (about 50 angstroms) within the XPS chamber.

The samples were then electroplated with copper as follows and qualitatively evaluated for their plating performance. The direct plating of copper onto thin ruthenium wafers was carried out in an EREX tool from EBARA. The detail tool configuration and design appeared in the aforementioned U.S. Published Patent Applications No. 2005/0199502 A1 and U.S. 2004/069648 A1. The copper plating chemistry in our study is comprised of copper sulfate, sulfuric acid, hydrochloride, and C-2001, B-2001, and L-2001 additives from Shipley. The current waveform was comprised of 5 seconds of immersion time without any current, 3 seconds of controlled potential to deposit an edge ring of copper, 10-25 seconds of linear current ramping up from 1.6 mA/cm$^2$ to 6 mA/cm$^2$, 30 seconds of controlled current deposition at 6 mA/cm$^2$, 10 seconds current density deposition at 10 mA/cm$^2$, 35 seconds of controlled current density deposition at 20 mA/cm$^2$, and 25 seconds controlled current density deposition at 30 mA/cm$^2$.

The results are tabulated in Table I below.

Example 1

A 200 mm silicon oxide wafer was deposited with ALD TaN and ALD Ru with 5 sccm oxygen flow rate. The thickness of the ruthenium film was about 10 nm. The copper deposited directly on top of this ruthenium surface was bright and shiny. Another ruthenium wafer made with the same ALD conditions was then analyzed with XPS for oxygen content both on the surface and in the bulk of the film. The surface oxygen was found to be 31% (atomic), and the bulk oxygen content was 5% (atomic).

Example 2

A 200 mm silicon oxide wafer was deposited with ALD TaN and ALD Ru with 10 sccm oxygen flow rate. The thickness of the ruthenium film was about 10 nm. The copper plated directly on this ruthenium surface appeared to be dark and powder-like. The plated copper was then dissolved in 10% HCl solution which resulted in a clean ruthenium surface again. Copper plating was carried out on this ruthenium wafer again and there was the same dark and particulate copper plated. Another ruthenium wafer made with the same ALD conditions was then analyzed with XPS for oxygen content both on the surface and in the bulk of the film. The surface oxygen was found to be 67% (atomic), and the bulk oxygen content was 59% (atomic).

TABLE 1

Plating performance of various ruthenium wafers with or without pretreatment.

| Example no. | WAFER | SURFACE OXIDE, ATOMIC PERCENT | BULK OXYGEN, ATOMIC PERCENT | PLATING PERFORMANCE |
|---|---|---|---|---|
| 1 | 200 mm ALD Ru2 | 31 | 5 | Bright & shiny Cu |
| 2 | 200 mm ALD Ru1 | 67 | 59 | Dark particulate Cu; after stripping, still plated dark Cu |
| 3 | 200 mm ALD Ru3 | 42 | 12 | Slight center haziness from 1$^{st}$ plating; after stripping, good Cu |
| 4 | 200 mm ALD Ru4 | 57 | 18 | Poor Cu from 1$^{st}$ plating; After stripping, good Cu |
| 5 | 300 mm ALD1 | 45.16 | / | Center hazy Cu as received/after FGA, bright and shiny Cu |
| 6 | 300 mm ALD2 | 39.38 | / | Center hazy Cu as received/after FGA, bright and shiny Cu |
| 7 | 300 mm ALD3 | 46.44 | / | Center hazy Cu as received/after FGA, bright and shiny Cu |
| 8 | 300 mm CVD Ru | 17.85 | / | Center hazy Cu as received/after FGA, bright and shiny Cu |
| 9 | CVD Ru without FGA | 54 | / | Dark and hazy copper |
| 10 | CVD Ru with FGA | / | / | Bright & shiny Cu |
| 11 | 48 hrs post FGA ALD Ru | / | / | Bright & shiny Cu |
| 12 | 72 hrs post FGA ALD Ru | / | / | Slight center haziness |
| 13 | Fresh PVD Ru | 0.13 | / | Bright & shiny Cu |
| 14 | Aged PVD Ru | 50 | / | Dark and hazy copper |
| 15 | FGA, aged PVD Ru | / | / | Bright & shiny Cu |

Example 3

A 200 mm silicon oxide wafer was deposited with ALD TaN and ALD Ru. The thickness of the ruthenium film was about 10 nm. The ruthenium wafer was then plated with copper. The plated copper was mostly bright and shiny, except for a little haziness in the center. The plated copper was then dissolved in 10% HCl solution and resulted in a clean ruthenium surface again. Copper plating was carried out on this ruthenium wafer again with the result that the plated copper was bright and shiny. Another ruthenium wafer made with the same ALD conditions was then analyzed with XPS for oxygen content both on the surface and in the bulk of the film. The surface oxygen was found to be 42% (atomic), and the bulk oxygen content was 12% (atomic).

Example 4

A 200 mm silicon oxide wafer was deposited with ALD TaN and ALD Ru. The thickness of the ruthenium film was about 10 nm. The ruthenium wafer was then plated with copper. There was only dark particulate copper plated. The plated copper was then dissolved in 10% HCl solution and resulted in a clean ruthenium surface again. Copper plating was carried out on this ruthenium wafer again with the result that the plated copper was bright and shiny. Another ruthenium wafer made with the same ALD conditions was then analyzed with XPS for oxygen content both on the surface and in the bulk of the film. The surface oxygen was found to be 57% (atomic), and the bulk oxygen content was 18% (atomic).

Examples 5, 6 and 7

300 mm silicon oxide wafers were deposited with ALD TaN and ALD Ru from a vendor. The thickness of the ruthenium film was about 10 nm. Three of the ruthenium wafers were plated with copper as received. There is hazy Cu plated in the center of the wafers. Another three ruthenium wafers were annealed in forming gas (FGA) for 30 minutes and then plated with Cu. The plated copper was bright and shiny. XPS analysis of three as-received ALD Ru wafers showed that the surface oxygen was found to be 45.16%, 39.38%, and 46.44% (atomic), respectively.

Example 8

300 mm silicon oxide wafers were deposited with CVD Ru. The thickness of the ruthenium films was about 8 nm. One ruthenium wafer was plated with copper as received. There was hazy Cu plated in the center of the wafer. Another ruthenium wafer was forming gas annealed for 30 minutes and then plated with Cu. The plated copper was bright and shiny. XPS analysis of one of the as-received CVD Ru wafers showed that the surface oxygen was found to be 17.85% (atomic).

Examples 9 and 10

300 mm silicon oxide wafers were deposited with CVD Ru. The thickness of the ruthenium films was about 8 nm. One ruthenium wafer was plated with copper as received. The plated Cu was dark and hazy in the center of the wafer. Another ruthenium wafer was forming gas annealed for 30 minutes and then plated with Cu. The plated copper was bright and shiny. XPS analysis of one of the as-received CVD Ru wafers showed that the surface oxygen was found to be 54% (atomic).

Examples 11 and 12

300 mm silicon oxide wafers were deposited with ALD Ru. The thickness of the ruthenium films was about 10 nm. The wafers were all forming gas annealed for 30 minutes. The annealed wafers were left sitting in ambient atmosphere. After 48 hours, one wafer was plated with Cu, and it was bright and shiny Cu. After 72 hours, another wafer was plated, and there was hazy Cu plated in the center of the wafer. Therefore we established that the better queue time between forming gas anneal of the ALD Ru wafer and the Cu plating to be 48 hours or less. Otherwise, ageing of the ruthenium plated wafer affects the quality of the Cu plating.

Examples 13, 14, & 15

200 mm PVD Ru wafers were deposited on silicon oxide substrates. The thickness of the ruthenium was about 20 nm. The fresh PVD ruthenium has very low oxygen content (0.13 atomic percent) on the surface. The wafer was plated with Cu without any pretreatments of the ruthenium surface. The Cu was bright and shiny. These ruthenium wafers were then left in ambient for about 6 months, and became aged PVD Ru wafers. One of the aged PVD Ru wafers was plated with Cu without pretreatment. The Cu was dark and hazy. Another of the aged PVD Ru wafers was forming gas annealed for 30 minutes and plated with bright and shiny Cu. We also observed that a thin PVD Ru film (about 4 nm thick Ru) aged much faster. After one week in ambient, the plated Cu showed haziness in the center on these thin PVD Ru wafers. Thus, it is also a good practice to always have FGA of PVD Ru before plating to eliminate any ageing effect.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A process for the formation of an interconnect in a semiconductor structure, the process comprising the steps of: forming a dielectric layer on a substrate; forming a first barrier layer on the dielectric layer; forming a second barrier layer on the first barrier layer, wherein the second baffler layer is selected from the group consisting of ruthenium, platinum, palladium, rhodium and iridium and wherein the formation of the second barrier layer is manipulated so that the bulk concentration of oxygen in the second barrier layer is 20 atomic percent or less; and directly forming a conductive layer on the second barrier layer.

2. The process of claim 1 wherein the conductive layer comprises copper or an alloy of copper.

3. The process of claim 1 wherein the second barrier layer is ruthenium.

4. The process of claim 1 wherein the first barrier layer is selected from the group consisting of tantalum nitride, titanium and titanium nitride.

5. A process for the formation of an interconnect in a semiconductor structure, the process comprising the steps of: forming a dielectric layer on a substrate; forming a first barrier layer on the dielectric layer; forming a second barrier layer on the first barrier layer, wherein the second baffler layer is selected from the group consisting of ruthenium, platinum, palladium, rhodium and iridium and wherein the formation of the second barrier layer is manipulated so that the bulk concentration of oxygen in the second barrier layer is 20 atomic percent or less; treating the second barrier layer so as to reduce the amount of oxide on the surface of the second baffler layer; and directly forming a conductive layer on the second baffler layer.

6. The process of claim 5 wherein the conductive layer comprises copper or an alloy of copper.

7. The process of claim 5 wherein the step of treating comprises exposing the surface of the second barrier layer to a substance which reduces or removes the oxide on the second barrier layer.

8. The process of claim 7 wherein the substance is selected from the group consisting of a reducing gas, a halide ion solution or a halide gas.

9. The process of claim 8 wherein the reducing gas is selected from the group consisting of forming gas and hydrogen plasma.

10. The process of claim 8 wherein the halide ion solution comprises, Cl—, Br— or I—.

11. The process of claim 8 wherein the halide gas comprises $Cl_2$, $Br_2$ or $I_2$.

12. The process of claim 5 wherein the second barrier layer is ruthenium.

13. A process for the formation of an interconnect in a semiconductor structure, the process comprising the steps of: forming a dielectric layer on a substrate; forming a first barrier layer on the dielectric layer; forming a second barrier layer on the first barrier layer by one of chemical vapor deposition (CYD) and atomic layer deposition (ALD), wherein the second barrier layer is selected from the group consisting of ruthenium, platinum, palladium, rhodium and iridium and wherein the formation of the second barrier layer is manipulated so that the bulk concentration of oxygen in the second baffler layer is reduced to a level at which a subsequently formed conductive layer appears bright and shiny; and directly forming a conductive layer on the second baffler layer, the conductive layer being bright and shiny due to such reduced level of the bulk concentration of oxygen in the second barrier layer.

14. The process of claim 13 wherein the bulk concentration of oxygen in the second barrier layer is 20 atomic percent or less.

15. The process of claim 13 wherein the conductive layer comprises copper or an alloy of copper.

16. The process of claim 13 further comprising the step of treating the second barrier layer so as to reduce the amount of oxide on the surface of the second barrier layer prior to the step of directly forming a conductive layer.

17. The process of claim 16 wherein the step of treating comprises exposing the surface of the second barrier layer to a substance which reduces or removes the oxide on the second barrier layer.

18. The process of claim 17 wherein the substance is selected from the group consisting of a reducing gas, a halide ion solution or a halide gas.

19. The process of claim 18 wherein the reducing gas is selected from the group consisting of forming gas and hydrogen plasma.

20. The process of claim 18 wherein the halide ion solution comprises, Cl--, Br-- or I--.

21. The process of claim 18 wherein the halide gas comprises $Cl_2$, $Br_2$ or $I_2$.

22. The process of claim 13 wherein the second barrier layer is ruthenium.

\* \* \* \* \*